US008586287B2

(12) United States Patent
Tonchev et al.

(10) Patent No.: US 8,586,287 B2
(45) Date of Patent: Nov. 19, 2013

(54) FABRICATION METHOD OF CYLINDRICAL GRATINGS

(75) Inventors: Svetlen Tonchev, Sofia (BG); Oliver Parriaux, Saint-Etienne (FR)

(73) Assignee: Sick Stegmann GmbH, Donaueschingen (DE)

( * ) Notice: Subject to any disclaimer, the term of this patent is extended or adjusted under 35 U.S.C. 154(b) by 0 days.

(21) Appl. No.: 13/443,443

(22) Filed: Apr. 10, 2012

(65) Prior Publication Data

US 2013/0052592 A1    Feb. 28, 2013

(30) Foreign Application Priority Data

Aug. 23, 2011    (EP) ..................................... 11290380

(51) Int. Cl.
*G03F 7/20*    (2006.01)
*G02B 5/18*    (2006.01)

(52) U.S. Cl.
USPC .............................. 430/321; 264/1.1; 264/2.5

(58) Field of Classification Search
None
See application file for complete search history.

(56) References Cited

U.S. PATENT DOCUMENTS

| 5,498,870 | A | 3/1996 | Ishizuka |
| 6,284,437 | B1 | 9/2001 | Kashyap |
| 6,344,298 | B1 | 2/2002 | Starodubov et al. |

FOREIGN PATENT DOCUMENTS

| EP | 1 462 831 | A1 |  | 9/2004 |
| EP | 2 367 058 | A1 | * | 9/2011 |
| JP | 5-312594 | A | * | 11/1993 |
| JP | 7-146405 |  |  | 6/1995 |
| WO | WO 97/26570 | A1 |  | 7/1997 |
| WO | WO 99/20427 |  |  | 4/1999 |

OTHER PUBLICATIONS

S. Tonchev, et al., "Holistic fabrication of stitchingless subwavelength cylindrical gratings by phase-mask coordinate transform", $2^{nd}$ EOS Conference on Manufacturing of Optical Components, XP008146106, May 2011, 2 pages.
Yves Jourlin, et al., "Miniature holistic displacement sensor by immersion diffractive interferometry", Optics Express, vol. 17, No. 11, XP55013761, May 25, 2009, pp. 9080-9088.
Joong-Mok Park, et al., "Fabrication of submicron metallic grids with interference and phase-mask holography", J. Micro/Nanolith MEMS MOEMS, vol. 10, No. 1, XP55013993, Jan.-Mar. 2011, 5 pages.
European Search Report issued Dec. 15, 2011, in European Patent Application No. 11290380.2, filed Aug. 23, 2011.
C. J. Moran-Iglesias, et al., "Improved grating microspectrometer", Prod. SPIE, vol. 5962, 2005, pp. 596225.1-596225.9.

* cited by examiner

*Primary Examiner* — John A. McPherson
(74) *Attorney, Agent, or Firm* — Oblon, Spivak, McClelland, Maier & Neustadt, L.L.P.

(57) ABSTRACT

A phase mask method to geometrically transform and to optically transfer a standard planar radial grating pattern into a cylindrical photoresist pattern at the circularly cylindrical wall of a given element. The planar radial grating pattern can be written with an integer number of lines having strictly constant period without any stitching problem. The photolithographic transfer is made by an illumination device providing a normal incident beam on the phase mask. The annular radial grating diffracts this normal incident beam, formed by plane waves, into two cylindrical waves of the first diffraction order ($T_{+1}$ and $Tr_{-1}$) which impinge on the circularly cylindrical wall and interfere in a photoresist layer deposited on the circularly cylindrical wall to give rise to an interferogram.

9 Claims, 3 Drawing Sheets

FABRICATION METHOD OF CYLINDRICAL GRATINGS

FIELD OF THE INVENTION

The present invention concerns a fabrication method of cylindrical gratings for possible application in the domain of high resolution optical measurement of rotation, in the domain of spectroscopy and more generally for the domain of diffractive optics involving cylindrical waves.

BACKGROUND OF THE INVENTION

The high resolution optical measurement of rotation is usually made by means of a radial diffraction grating of micron scale or submicron scale period in the form of a ring defined at the surface of a rotating encoder disk as shown in document U.S. Pat. No. 5,498,870. The two diffraction orders diffracted in transmission or in reflection, directed along and opposite to the tangential displacement direction at the impact point of an incident beam experience an optical phase shift of opposite sign proportional to the local linear displacement and are recombined by means of a second, non-rotating, radial grating which directs both phase shifted diffracted beams in a common direction where they interfere. For the interference contrast to be close to one (1), the relative positioning of the two radial gratings must be precise and stable during relative rotation. The smaller the encoder disk, the more critical the relative positioning conditions between the disk grating and the second grating. A small grating ring diameter implies in particular that the length of the radial grating lines must be short if an acceptable contrast is to be preserved upon relative rotation in the presence of eccentricity due to imperfect alignment between the rotation axis and the center of the encoder disk, and due to mechanical shocks; this in turn implies that the fraction of optical power impinging onto the encoder disk and experiencing diffraction and interference decreases with a decrease of the encoder disk diameter in order to preserve an acceptable interference contrast as described in document Yves Jourlin, Olivier Parriaux, and Jörg Fuchs, "Miniature holistic displacement sensor by immersion diffractive interferometry," Opt. Express 17, 9080-9088 (2009). As a result, a rotation encoder of small diameter of the state of the art either has its interference contrast spoiled by the least eccentricity or uses only a very small fraction of the available power of the light source.

It is therefore desirable to adopt a diffractive interferometric scheme which is little sensitive to eccentricity and in which most of the power delivered by the light source participates in the interference between the orders carrying the information on the rotation. This can be achieved by using two cylindrical gratings where the grating lines are parallel to the rotation axis and are defined on the circularly cylindrical wall of a circular encoder disk or rod.

It is to be noted that cylindrical gratings would not only be useful for stand alone rotation sensors. They could be used in direct drive systems where there is no room to place a standalone rotation encoder; therefore the encoding grating must be defined at the wall of the shaft. Beyond rotation measurement applications, there are other applications in metrology, in spectroscopy, and more generally in diffractive optics involving cylindrical waves, where fine pitch cylindrical gratings are needed.

The main difficulty in defining a possibly submicron short period corrugation grating at the wall of a circular plate or circular rod is to print an integer number of parallel grating lines and grooves in a closed circle without stitching error, and to print this cylindrical grating with strictly constant period, i.e., without wobble in the spatial frequency. The solution consisting in wrapping and pasting a thin plane grating of rectilinear lines around a cylindrical surface as disclosed in document JP 7146405 does not permit a precise stitching between the last and the first grating lines. Usually, the encoder disk is placed on a high accuracy lathe; a tool machines or prints the grating lines parallel to the rotation axis every increment of the angular abscissa as disclosed in document WO 99/20427 "Method for manufacturing of optical torque transducer". The regularity of the period and the accuracy of the stitching is however limited which makes such approach improper for fine pitch cylindrical gratings. It is therefore desirable to have a grating printing method which permits to solve the above mentioned problems.

It is to be noted that the LIGA process permits transferring the pattern of a thick planar metal mask into a polymer substrate by means of an almost diffraction-less X-ray beam. However, if the pattern of the X-ray mask is the corrugated edge of a metal layer defining a crenellation of micrometer or submicrometer period and submicrometer depth, the imperfect collimation of the X-ray beam results in a smoothing out of the corrugation on the wall at less than 1 millimeter under the metal mask as illustrated in document by C. J. Moran-Iglesias, A. Last, J. Mohr, "Improved grating spectrometer", Prod. SPIE, Vol. 5962, pp. 596225.1-596225.9. The LIGA process is thus not efficient for fabricating uniform cylindrical corrugations having long lines. This is a great limitation.

SUMMARY OF THE INVENTION

The invention concerns a fabrication method of a cylindrical grating at a circularly cylindrical surface of an element, characterised by the following steps:

providing a plane radial grating defining an annular phase mask with radial lines;

coating said circularly cylindrical surface with a photoresist layer;

arranging said circularly cylindrical surface relative to said annular phase mask so that the central axis of this circularly cylindrical surface comprises the centre of the annular phase mask, so that said central axis is substantially perpendicular to the plane defined by said annular phase mask, and so that the medium or media between this annular phase mask and the photoresist layer on the circularly cylindrical surface is transparent at least for a given wavelength;

exposing said annular phase mask with a light wave substantially at said given wavelength and substantially under normal incidence, said plane radial grating having a period selected so as to have the $+1^{st}$ and $-1^{st}$ diffraction orders propagating in said medium or media between the annular phase mask and the photoresist layer;

developing the photoresist layer resulting in a circularly cylindrical photoresist corrugation grating having lines parallel to said central axis.

Then, it is namely possible to form a final cylindrical grating by physically transferring the photoresist grating into the surface of the cylinder or by taking a nickel shim of the photoresist grating that is subsequently used for embossing or injection moulding or extruding said circularly cylindrical corrugation grating.

The present invention thus solves the stitching problem and the problem of a predetermined integer number of grating lines per closed circle by resorting to a novel phase mask method which allows a standard planar radial grating pattern to be geometrically transformed and optically transferred into a cylindrical photoresist pattern at the circularly cylindrical wall of an element. The planar radial grating pattern can be easily written with an integer number of lines having strictly constant period without stitching errors by means of the available tools of planar technologies such as a laser or electron beam generator and reactive ion etching.

The photolithographic transfer is made by illumination means which provide a normally incident beam represented by a plane wave impinging on the annular phase mask normally. It does not come to mind to a person skilled in the art that a beam incident normally on a planar phase mask performs the geometrical transformation from this planar radial grating to a circularly cylindrical grating whose central axis is perpendicular to the planar phase mask. Those skilled in the art have the experience of phase masks formed by a linear grating whereby a normally incident beam only transfers this linear grating into a linear grating in a plane parallel to the planar phase mask in the zone where an interferogram is formed by the overlapping positive and negative diffraction orders of the phase mask grating; there is no interferogram formed in a perpendicular plane placed outside the area where the phase mask grating is defined, in particular in a plane perpendicular to the grating lines. For transferring the linear grating in this plane perpendicular to the grating lines, the incident beam has to impinge on the planar phase mask with an oblique incidence, i.e., with a non-zero in-plane projection of its k-vector along the phase mask grating lines. Thus, a person skilled in the art would naturally use an oblique incidence for transferring a planar grating on a surface which is perpendicular to this planar grating as this is the case when a planar radial annular grating has to be transferred on a circularly cylindrical surface whose central axis is perpendicular to this planar radial annular grating. There is a further argument preventing those skilled in the art from using a normally incident beam onto the phase mask grating: The phase mask grating would diffract the $+1^{st}$ and $-1^{st}$ diffraction orders of such a normally incident beam in a plane which is parallel to the normally incident beam and normal to the grating lines. This implies that no interferogram would be formed in a plane parallel to the incident beam and parallel to the phase mask grating lines and located outside the phase mask grating area since the diffracted light beam crossing this plane consists of non-interfered light, the $+1^{st}$ and $-1^{st}$ orders propagating in opposite directions.

However, the circular geometry of the planar radial annular grating, and the axial symmetry of the normally incident beam, which illuminates all points of the phase mask surface with the same amplitude and phase, give rise to two diffracted cylindrical waves, the general $+1^{st}$ and $-1^{st}$ orders, which interfere everywhere in the form of an interferogram having dark and bright planes of constant angular period containing the incident beam axis, in particular on the photoresist-coated wall of a circular cylinder whose axis is parallel to the incident beam axis and which contains the center of the radial phase mask grating where the interferogram prints a latent grating of lines parallel to the incident beam and cylinder axes in the photoresist layer.

A major advantage of the normal incidence according to the present invention results from the fact that the $0^{th}$ diffraction order always remains a substantially collimated beam propagating in the direction of the central axis of the circularly cylindrical surface and thus does not intercept this circularly cylindrical surface. This $0^{th}$ diffraction order will thus never interfere with the $+1^{st}$ diffraction order or the $-1^{st}$ diffraction order in the cylindrical photoresist layer. As a consequence, there is no requirement on the diffraction efficiency of the $0^{th}$ diffraction order. This simplifies the phase mask fabrication and suppresses the requirement of low diffraction efficiency of the $0^{th}$ order which prevails when an annular phase mask is exposed to a light wave under conical incidence.

In a first variant, the annular phase mask is a transmission phase mask directly arranged at a top face of the cylindrical element defining the circularly cylindrical surface, this cylindrical element being transparent for the given wavelength.

In a second variant, the annular phase mask is a transmission phase mask arranged on, under or into a stand alone disk or wafer arranged over or on a top face of the cylindrical element, this disk or wafer being transparent at the exposure wavelength.

It is to be noted that the annular phase mask is either a reflective phase mask or a transmission phase mask, i.e. the phase mask is used either in reflection or in transmission.

It is also to be noted that, depending on the considered variant of the invention, the circularly cylindrical surface is either convex or concave and respectively defines an external wall or an internal wall of the cylindrical element.

According to a particular feature of the invention, a layer is deposited on the area outside the annular phase mask grating, this layer being absorptive or reflective when this annular phase mask is used in transmission, respectively absorptive or transmissive when this annular phase mask is used in reflection.

The present invention also allows to define several gratings of different period next to each other on the same cylinder, and it also allows the printing of two or three identical cylindrical gratings on the same wall having a prescribed angular shift between each other so as to enable the simultaneous detection of non-degenerate rotation signals (for instance sine and cosine functions) in a rotation encoder application. It also allows the printing of a cylindrical grating made of different sections, each section having a different grating period or having the same period but a definite phase shift between them.

BRIEF DESCRIPTION OF THE DRAWINGS

The present invention will be described subsequently in more detail with reference to the attached drawing, given by way of examples, but in no way limited thereto, in which.

DETAILED DESCRIPTION

Figure 1:
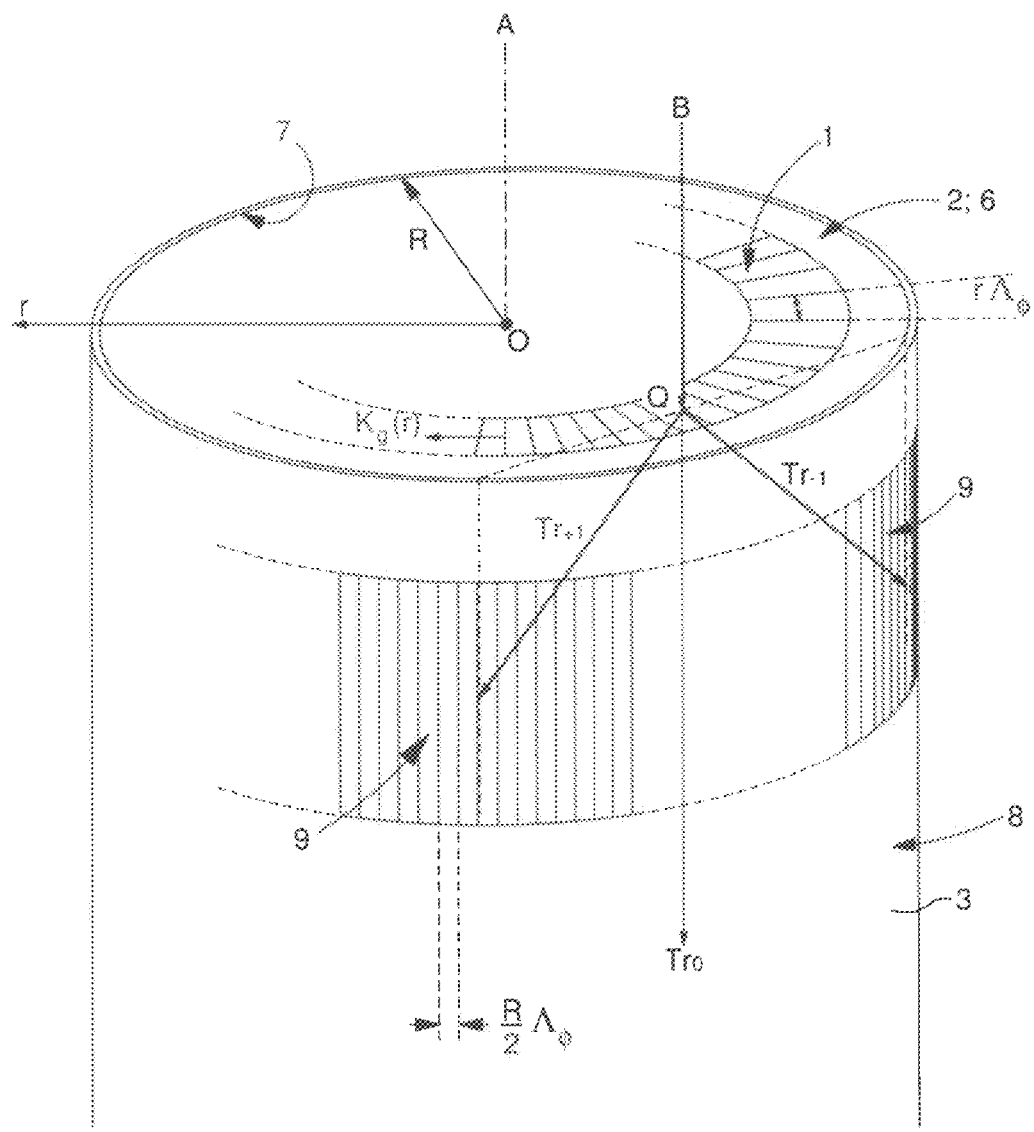
FIG. 1 is a perspective view of an annular phase mask arranged at the upper face of a circular cylinder for putting into practice the fabrication method of a cylindrical grating according to a first embodiment of the present invention wherein the annular phase mask is used in transmission.

A first embodiment of the invention will now be described with reference to FIGS. 1 to 3. A binary radial grating 1 of depth $t_g$ defined at the upper face 2 of a circularly cylindrical element 3 of radius R, of transparent material of refractive index $n_s$, comprising lines 4 of width $w_l(r)$ and grooves 5 of width $w_g(r)$ where r is the radial coordinate with origin O. The radial dependence of $w_l(r)$ and $w_g(r)$ is linear in the radial coordinate r, so is the period $\Lambda_g(r)=w_l(r)+w_g(r)$ of the grating phase mask 1. The dimensionless angular period $\Lambda_\phi$ is $\Lambda_g(r)/r$. Grating 1 covers an area in the form of a ring of inner radius $R_i$ and external radius $R_e$. Thus, grating 1 defines a planar annular grating with radial lines (annular radial grating).

There can be several concentric rings of different corrugation period and phase and of different length of lines (and grooves). The center O of the radial grating 1 is the point where all grating lines 4 and grooves 5 intersect. The center O is also preferably the center of the grating ring, but not necessarily, and is on the axis A of the cylindrical element 3. The upper face 2 of the element 3 except the ring of grating 1 is preferably coated by an absorptive or reflective layer 6 such as chromium to prevent scattering in the cylindrical element 3 of non-diffracted transmitted light which could interfere with the wave diffracted by grating 1 and to reduce the contrast of the resulting cylindrical resist grating 9 the formation of which will be described below.

The $0^{th}$ transmitted order $Tr_0$ of grating 1 originating from any point Q is propagating into element in a direction parallel to the axis A and to the incident ray B. At point Q ray B is diffracted into the element 3 by the phase mask grating 1 of local radial K-vector $K_g(r)=2\pi/\Lambda_g(r)$. $K_g(r)$ is directed along the tangent of a circle of radius r centered at O, i.e. along the azimuthal unit vector of a cylindrical coordinate system r, $\phi$, z; z being along the cylinder axis A. At point Q the $+1^{st}$ and $-1^{st}$ diffraction orders $Tr_{+1}$ and $Tr_{-1}$ diffracted in transmission into element 3 have no K-vector radial component, respectively an azimuthal component $+/-K_g(r)$ and an axial component $k_0(n_s^2-K_g^2/k_0^2)^{1/2}$ where $k_0=2\pi/\lambda$, $\lambda$ being the wavelength of the incident beam/ray B. In element 3 the diffraction orders of order m propagate under an angle $\eta_m$ with the surface 2 of the cylindrical element 3 given by $\cos\eta_m = mK_g/n_sk_0$.

In the element 3 the two $+1^{st}$ and $-1^{st}$ diffraction orders give rise to an interferogram of optical power distribution proportional to $(1+q\cdot\cos(2K_g(r)\cdot r\cdot\phi))$ where q is an interference contrast term comprised between 0 and 1 depending on the incident polarization. As $K_g(r)$ of a radial grating is inversely proportional to r, the angular period $\Lambda_{\phi i}$ of the interferogram along the azimuthal abscissa $\phi$ at any radial abscissa r is constant and equal to $\Lambda_{\phi i}=\Lambda_\phi/2$. This means that the period $\Lambda_c(R)$ of the interferogram projected onto the cylindrical wall 7 coated with a photoresist layer 8 at r=R is $\Lambda_c(R)=\Lambda_\phi R/2$.

Figure 3:
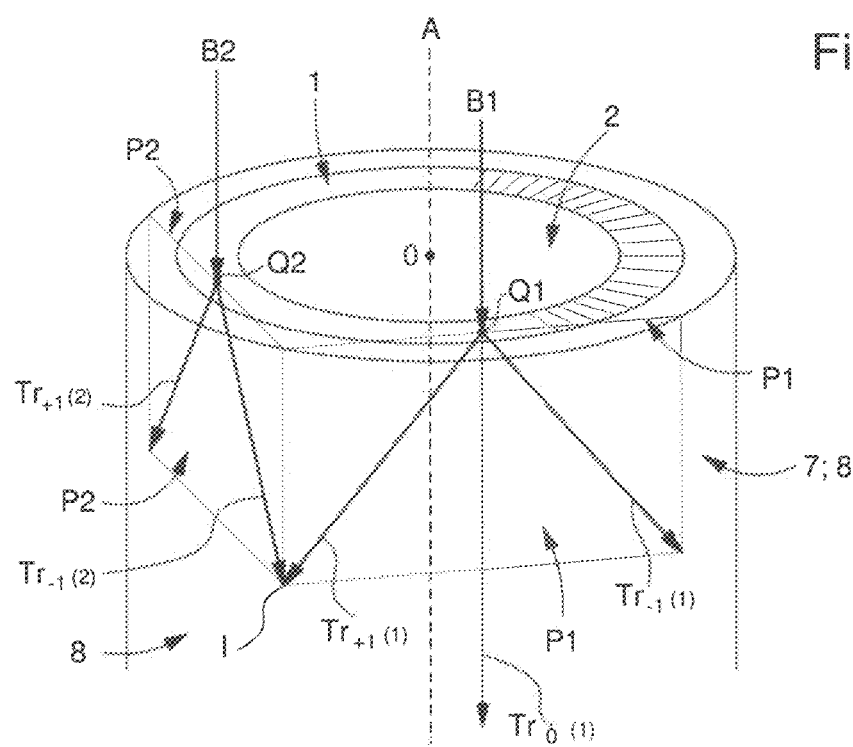
FIG. 3 is a perspective view of the device of FIG. 1 schematically showing the interference at the cylinder wall between a $+1^{st}$ diffraction order and a $-1^{st}$ diffraction order generated by the annular phase mask with radial lines.

FIG. 3 schematically shows a simplified light ray representation of the formation of interference fringes in the photoresist layer 8 disposed on the circularly cylindrical surface 7 of the transparent cylinder 3. Each ray B1, respectively B2 of the incident beam impinging on the annular radial grating 1 forming the phase mask is diffracted at least in the transmitted $-1^{st}$ and $+1^{st}$ diffraction orders $Tr_{-1}(1)$ and $Tr_{+1}(1)$, respectively $Tr_{-1}(2)$ and $Tr_{+1}(2)$ in a geometrical plane P1, respectively P2 which is perpendicular to the grating line or groove at the incidence point Q1, respectively Q2. The angle between planes P1 and P2 depends on the radial position of the planar annular grating relative to the cylinder wall: the closer the planar grating to the cylinder wall, the larger the angle between P1 and P2. Depending on the geometrical parameters of the cylinder (R) and of the annular radial grating 1 ($R_i$, $R_e$) as well as on the angular period $\Lambda_\phi$ of this grating, the transmitted $-1^{st}$ and $+1^{st}$ diffraction orders give rise to an interferogram having a given height along the direction of axis A and starting at a determined distance from the position of the phase mask grating on the cylinder axis. Thus, this interferogram occupies a given section of the circularly cylindrical surface 7 as shown in FIG. 1. For each point I in this section or within the photoresist layer disposed on this section, there are only two diffracted rays of the first order $Tr_{+1}(1)$ and $Tr_{-1}(2)$ respectively originating from two determined points Q1 and Q2 of the phase mask 1 which impinge on this point I and interfere there. Thus, in the absence of other spurious higher diffraction order, it is possible to obtain an interferogram with a high contrast. According to the present invention, the $0^{th}$ diffraction order does not impinge on the cylindrical surface 7 of the cylindrical element 3. It is to be noted that Q1 and Q2 have both the same radial coordinate r and that all diffracted rays interfering in the photoresist layer initially have a same phase because the normally incident beam on the planar surface of the phase mask is formed by planar waves at least in the region of this phase mask.

The azimuthal uniformity of the interferogram at the cylinder wall is ensured by the normally incident beam having a radial or an azimuthal polarization. The interferogram contrast q does not depend on the diffraction efficiency of the $+1^{st}$ and $-1^{st}$ orders of the phase mask grating, therefore q does not depend on the incident beam being radially or azimuthally polarized. The interference contrast depends on the angle between the two electric field vectors of the diffracted beams $Tr_{+1}(1)$ and $Tr_{-1}(2)$: the contrast term q is zero if this angle is 90 degrees. Therefore, if the incident beam is radially polarized, the angle between OQ1 and OQ2 in FIG. 3 must not be close to 90 degrees. If the incident beam is azimuthally polarized, the angle $\eta_1$ must not be close to 45 degrees.

Figure 2:
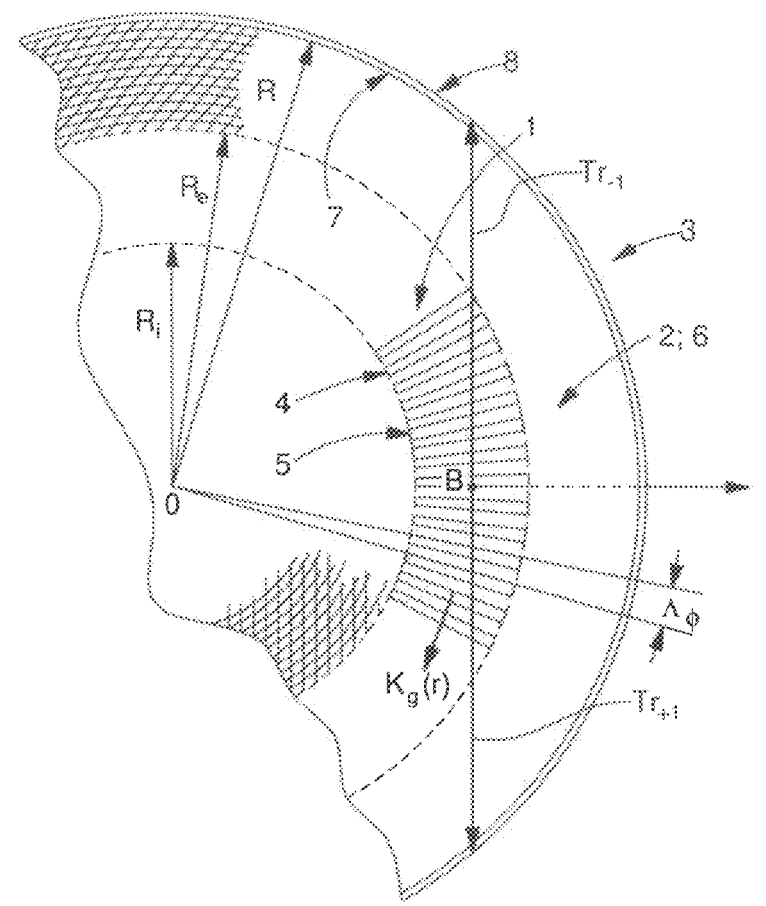
FIG. 2 is the top view of the device shown in FIG. 1.

The exposure of the photoresist layer 8 to the interferogram after development gives rise to a corrugation grating 9 in the photoresist layer of period $\Lambda_{100}R/2$ as represented in perspective in FIG. 1. The lines and grooves of the grating transferred onto the cylindrical wall 7 are parallel to the axis A. An essentially sinusoidal corrugation profile results if the photoresist is set at its linear regime by uniform pre-exposure, and a binary corrugation profile results if the photoresist is set below threshold and exposed above saturation. The deposition of a uniform photoresist coating 8 on the cylinder wall is preferably made by dip-coating. The photoresist thickness is adjusted so as to prevent the creation of standing wave field nodes within the photoresist layer 8; this is the case if high reflection occurs at the air-photoresist interface in case the incidence angle of the $+/-1^{st}$ orders at the cylindrical wall is large. The formation of a standing wave can be suppressed by immersing the cylinder in a liquid of refractive index close to $n_s$, as for instance glycerol, which does not perturb the photochemistry of a standard positive photoresist. An index matching liquid will also be used in case of total internal reflection in the cylindrical element with air as the external medium. As an alternative to an external liquid, the photoresist layer 8 can be coated with an absorptive film of non-critical thickness such as an absorptive latex film to suppress the reflection at the photoresist-air interface.

As from the photoresist development step, a number of processes can be used to obtain a cylindrical grating in hard material such as dry or wet etching of the element wall 7, or the electrochemical or electroless growth of a metal shim (nickel for instance) on the resist grating 9, followed in turn by a highly productive injection molding or UV- or hot-embossing process from a nickel shim or casting or extrusion. A grating in hard material can also be obtained by a lift-off process whereby the developed photoresist grating 9 having its grooves preferably in the form of inverse trapezes is first coated by a metallic or dielectric layer, then the photoresist trapezes are chemically removed together with the layer material deposited on them, leaving lines of the deposited material where the resist grooves were.

The exposure radiation is preferably narrow band and has a high spatial coherence such as that of a HeCd laser at 442 nm or 325 nm wavelength or a single transverse mode semiconductor laser at 406 nm wavelength.

The normally incident beam B can cover the whole phase mask grating or a part of it which must be large enough to allow the interference of the $-1^{st}$ and $+1^{st}$ diffraction orders on the circularly cylindrical surface 7 of the cylinder element 3. i.e. in the photoresist layer 8. In case the beam B covers only a part of the phase mask grating, a high accuracy rotation of this beam around the central axis A is needed with possibly several turns to smooth the dose distribution across the stitching zone. Delivering the total exposure dose in the form of several turns with small dose permits to limit the dose jumps where the exposure began and where it ended. This exposure configuration is particularly advantageous for the writing of a cylindrical grating at the wall of a cylinder of large diameter, for instance as large as 300 mm where the radial phase mask grating 1 also has a large inner and outer diameter, for instance 293 and 298 nm respectively. The normally incident exposure beam diameter must be at least three times larger than the chord between the two intersection points at the cylinder wall of the $+1^{st}$ and $-1^{st}$ diffraction orders emanating from a single point of the phase mask grating, and the ring of the phase mask radial grating must be close to the cylinder wall.

In a preferred variant, measures are taken to ensure an even power distribution in the photoresist layer 8 along the z axis by shaping the radial power distribution in the incident beam.

The pattern of the phase mask grating 1 comprises radial lines 4 and grooves 5 of radially dependent widths $w_l$ and $w_g$ respectively. It is preferably a binary corrugation with essentially vertical walls. The pattern can be written by means of a laser or electron beam pattern generator in a photo- or electron-sensitive resist layer. A subsequent etching process transfers the resist grating pattern in the form of rectangular profile grooves into the element surface 2 at a depth $t_g$ or, as shown in a variant on FIG. 4 which will be described later, into and all through a high index layer 12 of refractive index $n_h$ and appropriate thickness $t_h$ deposited onto surface 2 of the cylinder 3, $t_h$ being also the depth of the grooves. At the exposure wavelength λ the minimum period $\Lambda_m$ of the phase mask grating 1 which can be projected onto the cylindrical wall 7 is $\Lambda_m = \lambda/n_s$ so that the $+1^{st}$ and $-1^{st}$ diffraction orders can propagate into the cylindrical element 3. In order to prevent the propagation of the $3^{rd}$ order diffraction orders in the element 3, if needed, the maximum period $\Lambda_M$ of the phase mask grating 1 which can be projected onto the cylinder wall 7 is $\Lambda_M = 3\lambda/n_s$.

Normal incidence preventing an intersection between the $0^{th}$ transmitted diffraction order and the cylinder wall, the structure and profile of the phase mask grating can be chosen rather freely. In particular, because it is not needed to take care of the $0^{th}$ diffraction order, the profile of the radial grating can be optimized for suppressing the second diffraction order.

In case the period at the outer boundary of the ring forming the phase mask grating is smaller than the cutoff of the second diffraction orders $\Lambda(Re) < 2\lambda/n_s$ where λ is the exposure wavelength and $n_s$ is the cylinder refractive index), the only requirement on the grating structure and profile is on the diffraction efficiency of the $+1^{st}$ and $-1^{st}$ transmitted orders which have to be non-zero. This implies that the grating of the phase mask can for instance simply be a binary corrugation in fused silica as in FBG (Fiber Bragg Grating) phase masks. It can also be a simple chromium mask grating on a glass or fused quartz substrate.

In case the period at the inner boundary of the ring forming the phase mask grating is larger than $2\lambda/n_s$, the second transmitted orders propagate and form an interferogram at the wall of the cylinder. If this interferogram overlaps with the desired $+1^{st}$ and $-1^{st}$ order interferogram, the latter will be undesirably over-modulated by the former. However, there are ways to keep the diffraction efficiency of the second orders close to zero, for instance by adjusting the depth and duty cycle of a binary corrugation as this is currently made in FBG phase masks. If the period at the inner boundary of the ring forming the phase mask grating is larger than $3\lambda/ns$, the third transmitted orders propagate. Their efficiency is impossible to cancel in a binary grating. However, the 3rd orders intersect the cylinder wall at points higher than the $1^{st}$ orders do, therefore it is possible to establish the conditions for a geometrical separation between the desired first order cylindrical grating and the third order grating at the cylinder wall. It is to be noted that this also true for the second order grating. However, the separation between the first order resulting cylindrical grating and the third order resulting cylindrical grating is less limiting for the dimensions of the annular radial grating 1 and of the cylinder element 3.

With the expression of the height $H_m(r)$, defined as from the position of the phase mask center O on the cylinder axis A, at which the interferogram of $m^{th}$ order forms at the cylinder wall, the conditions can be set for non-overlapping interferograms. This expression is given by $$H_m(r) = (R^2 - r^2)^{1/2} ((n_s \cdot \Lambda_\phi \cdot r/(m\lambda))^2 - 1)^{1/2}$$

where R is the cylinder radius, r the radial coordinate in the phase mask grating ring, $\Lambda_\phi$ is the angular period of the phase mask grating. By using this algebraic expression, it is easy to assure that $H_3(R_i) < H_1(R_e)$ so that no overlapping occurs. A remarkable feature of the dependence of $H_m$ on r is that it is not monotonic: there is a radius $r = r_{mMax}$ where $H_m$ is maximum, $H_m = H_{mMax}$. This occurs at $$r_{mMax} = R((1 + (m\lambda/(n\Lambda_\phi R))^2)/2)^{1/2}$$

and the maximum of $H_m$ is:

$$H_{mMax} = ((n_s \Lambda_\phi/(m\lambda))^2 R^2 - 1)/(2 n_s \Lambda_\phi/(m\lambda))$$

It is important to note that, if the center of the phase mask grating ring is placed at $r = r_{1Max}$, i.e., if $(Ri+Re)/2$ is substantially equal to $r_{1Max}$, the length of the cylindrical grating lines printed on the cylinder wall by the +1st and $-1^{st}$ order interferogram will be minimum. Therefore, if the aim is to obtain long cylindrical grating lines, the center of the phase mask grating ring must be chosen where the derivative $dH_m(r)/dr$ is large.

Advantage can be taken from the period magnification which results from the cylindrical symmetry: by setting R large enough with respect to $R_i$ and $R_e$, an interferogram period as large as desired can in principle be defined without any spurious over-modulation.

The radially variable period of the phase mask grating 1 and the line/groove ratio can be produced by electron beam patterning with high precision and can be varied with high flexibility across the whole area of grating 1. In particular, the area of grating 1 can be composed of two or three sub-areas of concentric ring shape of the same angular period $\Lambda_\phi$ but predetermined angular shift corresponding to a prescribed fraction of the period $\Lambda_\phi$. This results in two or three grating tracks on the cylindrical wall 7 of identical period but predetermined shift. This is an important characteristic of the disclosed grating writing method for the fabrication of rotation encoders where a first grating track delivers the sinus and a second grating track delivers the cosines of the rotation signal. If a shift of a fraction 1/N of a period at the cylinder wall between two grating segments or rings is desired, N being an integer number larger than 1, the corresponding shift in the phase mask grating 1 is a fraction 1/(2N) of a period.

The radial phase mask grating can comprise a number of concentric sub-areas of different angular period which results on the cylindrical wall 7 in a number of cylindrical gratings of lines parallel to axis A and of different periods. In a further interesting variant, the radial phase mask grating can be decomposed in a number of sections of identical azimuthal period with a phase shift between them in order to project on the cylinder wall 7 an interferogram having phase shifted sections. This is used for instance for having phase shifted grating sections in the same grating track on the cylinder. In these variants it is advantageous to place the phase mask grating close to the outer diameter of the cylinder in order to limit the extent of the dead zone between sections.

Figure 4:
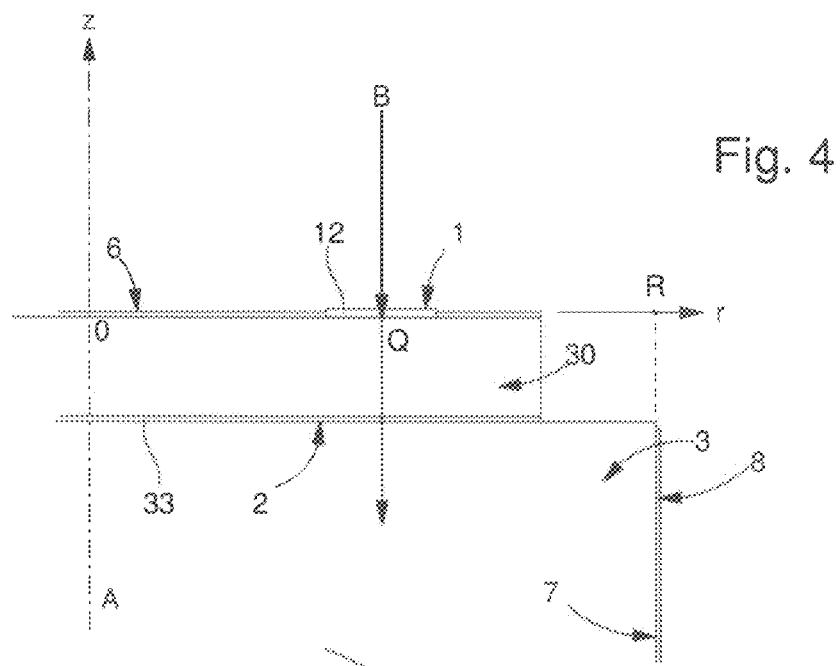
FIG. 4 is the transverse view of a transfer annular phase mask formed in or on a stand alone disk which is arranged on the top face of a circularly cylinder for putting into practice the fabrication method according to a particular variant of the present invention.

The interferogram does not have to be printed at the end surface of the very cylinder at the lateral surface of which the phase mask is micro-structured. As illustrated in FIG. 4, higher productivity and more flexibility is gained by defining the phase mask 1 on a standalone disk or wafer 30. The cylinder 3 at the surface of which the interferogram is to be projected is placed concentrically with the stand alone phase mask support 30 which is arranged on or over the top face 2 of the cylinder 3, preferably with an index matching liquid film 33 in-between. In a variant, the phase mask 1 can be placed at the bottom surface of the disk or wafer 30, at the side of the index matching fluid. In this case the grating lines 4 of the phase mask grating 1 are preferably made of a high refractive index material such as $Si_3N_4$ or $Ta_2O_5$ or $TiO_2$. In a further variant, the phase mask is formed by an index modulation within the disk or wafer 30 obtained for instance by ion implantation or by embedding a high index corrugation within a sandwich of two plates by wafer bonding method.

Figure 5:
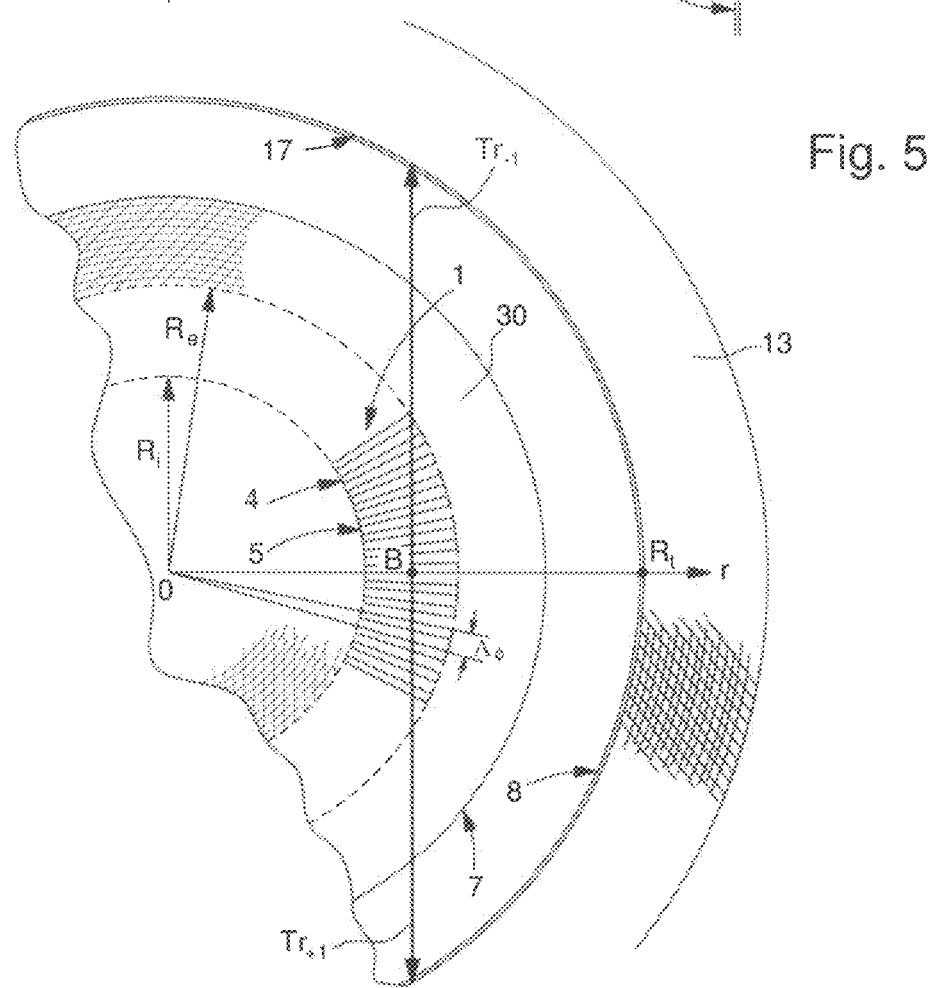
FIG. 5 is the top view of an annular phase mask with radial lines arranged at the upper face of a cylinder or disk for putting into practice the fabrication method according to a second embodiment of the present invention wherein the annular phase mask is used in reflection.

The first embodiment, as shown in the FIGS. 1 to 4, concerns a fabrication method for a cylindrical grating at the convex wall 7 of a circular plate or rod by means of a radial phase mask grating defining a transmission grating. According to the invention, the same method can be used to project the interferogram onto the concave surface 17 of an element 13 having a circularly cylindrical surface 17 of inner radius $R_t$ surrounding a support 31 on which the annular phase mask is arranged concentrically to the circularly cylindrical surface 17, as illustrated in FIG. 5. In a first variant, according to a second embodiment of the fabrication method, the phase mask is a reflection grating. The support 31 is placed in or under a circularly cylindrical hole of the element 13. The photoresist layer 8 is spread at the inner wall 17 defined by the hole of the element 13. The period $\Lambda_t$ of the grating printed in the photoresist layer 8 by the interferogram at the surface 17 of the element 13 is $\Lambda_t = \Lambda_\phi R_t / 2$. In the second embodiment, layer 6 is an absorptive or highly transmissive layer for the incident beam.

It is to be noted that further embodiment of the invention can be used for printing a cylindrical grating, in particular onto the inner concave surface of an element having a circularly cylindrical hole. Thus, in a further embodiment, the incident beam B propagates through the support 31 before impinging on the annular radial grating 1. In another embodiment, it is possible to use the support 30 shown in FIG. 4 with a transmission grating and to arrange this support 30 above or in the hole of element 13. In the case of a tube, if it is transparent for the wavelength of the incident beam, it is also possible to form a cylindrical grating at the external wall of the tube by using a support 31 or 30 with a phase mask diffracting the light in the hole of the tube, this diffracted light then going through the transparent tube and finally form an interferogram in the photoresist applied on the external wall of the tube. In all embodiment, if needed or advantageous, an index matching liquid can be used between the support 31 or 30 and the circularly cylindrical surface 17 of the element 13 (e.g. a tube).

An alternative to an exposure method applied to a concave wall is to make a negative replica of a cylindrical grating made on a convex cylinder 3 as initially described. This replica can be made in the form of a nickel shim grown on the convex photoresist grating followed by the dissolution of the resist grating and withdrawal or dissolution of the cylindrical element. The Ni-shim becomes the wanted concave grating. Higher productivity can be obtained by replicating this concave grating in the form of a nickel convex cylindrical grating, itself being replicated, possibly several times, to give rise to a number of replicated concave gratings.

A specific advantage of the disclosed phase mask grating writing method is that it can write a grating of period notably larger than the wavelength if R or $R_t$ is large without suffering from the presence of high diffraction orders since the phase mask grating generating the circularly cylindrical interferogram can be made to substantially diffreact the $+/-1^{st}$ orders only or to simply be placed at a small enough radius where the period does not diffract orders larger than 1.

The photoresist coated wall onto which the interferogram is projected could also be a cone or any transparent body 34 of smooth surface of circular symmetry with a resist layer spread at its surface whose radius $R_{co}(z)$ has a linear or non-linear dependence on the axial coordinate z. The resulting period $\Lambda_{co}(z)$ of the grating projected onto the cone wall is $\Lambda_{co}(z) = \Lambda \phi R_{co}(z)/2$; the angular period remains the same and is independent of z, but the period $\Lambda_{co}$ at the surface varies with z and is proportional to $R_{co}(z)$. This can be used for an esthetic effect as it is known that the eye is very sensitive to phase jumps (i.e. to stitching effects) and non-uniformities.

What is claimed is:

1. A fabrication method of a cylindrical grating at a circularly cylindrical surface of an element, characterized by the following steps:

providing a annular phase mask formed by a plane radial grating;

coating said circularly cylindrical surface with a photoresist layer;

arranging said circularly cylindrical surface relative to said annular phase mask so that the central axis of this circularly cylindrical surface comprises the center of the annular phase mask, so that said central axis is substantially perpendicular to the plane defined by said annular phase mask, and so that a medium or media between this annular phase mask and the photoresist layer on the circularly cylindrical surface is transparent at least for a given wavelength;

exposing said annular phase mask with a light wave at said given wavelength and under substantially normal incidence, said plane radial grating having a period selected so as to have the $+1^{st}$ and $-1^{st}$ diffraction orders ($Tr_{+1}$ and $Tr_{-1}$) propagating in said medium or media between the annular phase mask and the photoresist layer and giving rise to an interferogram in said photoresist layer;

developing the photoresist layer resulting in a circularly cylindrical photoresist corrugation grating (9) having lines parallel to said central axis.

2. The fabrication method of a cylindrical grating according to claim 1, wherein said annular phase mask is a transmission phase mask directly arranged on a end face of said element (3) which is transparent for said given wavelength.

3. The fabrication method of a cylindrical grating according to claim 2, wherein a layer is deposited on the area outside said annular phase mask, this layer being absorptive or reflective for said given wavelength.

4. The fabrication method of a cylindrical grating according to claim 1, wherein said annular phase mask is a transmission phase mask arranged on, under or into a stand alone disk or wafer which is arranged relative to said element so that said interferogram occurs in a given section of said circularly cylindrical surface of this element, this disk or wafer being transparent for said given wavelength.

5. The fabrication method of a cylindrical grating according to claim 1, wherein said annular phase mask is a reflection phase mask arranged on, under or into a standalone disk or wafer which is arranged relative to said element so that said interferogram occurs in a given section of said circularly cylindrical surface of this element.

6. The fabrication method of a cylindrical grating according to claim 5, wherein a layer is deposited on the area outside said annular phase mask, this layer being absorptive or transmissive for said given wavelength.

7. The fabrication method of a cylindrical grating according to claim 1, wherein said circularly cylindrical surface is convex and defines an external wall of said element.

8. The fabrication method of a cylindrical grating according to claim 1, wherein said circularly cylindrical surface is concave and defines an internal wall of said element.

9. The fabrication method of a cylindrical grating according to claim 1, wherein it comprises a final step consisting in forming said cylindrical grating by physically transferring or embossing or injection molding or extruding said circularly cylindrical photoresist corrugation grating.

* * * * *